(12) United States Patent
Liu et al.

(10) Patent No.: US 10,943,754 B2
(45) Date of Patent: Mar. 9, 2021

(54) CIRCUIT BREAKER APPARATUS AND SYSTEM

(71) Applicant: DELTA ELECTRONICS (SHANGHAI) CO., LTD., Shanghai (CN)

(72) Inventors: Teng Liu, Shanghai (CN); Lifeng Qiao, Shanghai (CN); Dehui Zhang, Shanghai (CN); JianPing Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 216 days.

(21) Appl. No.: 16/379,253

(22) Filed: Apr. 9, 2019

(65) Prior Publication Data
US 2020/0219692 A1 Jul. 9, 2020

(51) Int. Cl.
*H02M 3/158* (2006.01)
*H02H 3/087* (2006.01)
*H01H 75/10* (2006.01)
*H02H 1/00* (2006.01)

(52) U.S. Cl.
CPC .............. *H01H 75/10* (2013.01); *H02H 1/00* (2013.01); *H02H 3/087* (2013.01); *H02M 3/158* (2013.01)

(58) Field of Classification Search
CPC ................................ H02H 3/087; H02M 3/158
USPC ........... 323/271; 361/56, 87, 93.1, 93.9, 101
See application file for complete search history.

(56) References Cited

U.S. PATENT DOCUMENTS

| 8,045,309 B2* | 10/2011 | Shimada | H02M 7/217 361/93.1 |
| 9,425,612 B2* | 8/2016 | Tsao | H02J 7/0029 |
| 2012/0099236 A1* | 4/2012 | Cyuzawa | H02J 1/06 361/101 |
| 2013/0099574 A1* | 4/2013 | Bourgeois | H02J 9/062 307/66 |
| 2014/0029152 A1* | 1/2014 | Mazzola | H02H 3/087 361/115 |

(Continued)

OTHER PUBLICATIONS

European Search Report for European Application 19190357.4, dated Jan. 28, 2020.

*Primary Examiner* — Gary A Nash
(74) *Attorney, Agent, or Firm* — Nixon Peabody LLP; Thomas P. Pavelko

(57) ABSTRACT

Disclosed is a circuit breaker apparatus, including a first switching assembly, a first controller, a second switching assembly and a second controller. The first switching assembly is connected in series between a positive pole of a power supply and a load. The first switching assembly includes multiple first switching units in series. The first controller is electrically connected to a first pre-set reference potential of the first switching assembly. The first controller is electromagnetically coupled with each first switching unit through a first transformer unit. The second switching assembly is connected in series between a negative pole of the power supply and the load. The second switching assembly includes multiple second switching units in series. The second controller is electrically connected to a second pre-set reference potential of the second switching assembly. The second controller is electromagnetically coupled with each second switching unit through a second transformer unit.

20 Claims, 7 Drawing Sheets

(56) References Cited

U.S. PATENT DOCUMENTS

2015/0069842 A1\* 3/2015 Niu .................. H02J 9/061
 307/64
2015/0109077 A1 4/2015 Tomimbang et al.
2016/0315467 A1 10/2016 Eckel et al.

\* cited by examiner

CIRCUIT BREAKER APPARATUS AND SYSTEM

TECHNICAL FIELD

The present disclosure relates to a technical field of circuit breaker, and more particularly to a circuit breaker apparatus and system.

BACKGROUND

In the application of long distance Alternating Current (AC) transmission, because the parasitic parameters (inductive reactance and capacitive reactance) of the transmission line may have impact on the transmission capacity of the AC transmission, Direct Current (DC) transmission is adopted to effectively eliminate the impact of the parasitic parameters of the transmission line. For the DC transmission system, due to a plurality of loads on the electricity consumption side, when a transmission line fault of one single load occurs, in order to keep the whole system unaffected, a DC circuit breaker is definitely adopted to cut off the fault branch, thus a solid state DC circuit breaker is a key assembly of the DC transmission system.

The solid state DC circuit breaker includes at least one semiconductor switching device which is adopted to cut off the fault current, thus the whole DC circuit breaker system requires a controller to control the semiconductor switching device. For the application of the medium voltage DC transmission, an insulation problem is definitely existed between the control signal of the controller and the main power loop. Meanwhile, in order to reduce the control delay, a transformer is generally adopted to isolate the control panel from the main power loop. In this case, the magnitude of the insulation voltage will directly affect the difficulty in design of the isolation transformer. Thus, it is necessary to reduce the insulation requirement through reasonable system architecture design. But the system architecture of the existing circuit breaker has a higher insulation voltage and thus may increase the difficulty in the insulation design.

SUMMARY

In view of this, to address the problem of increased difficulty in design of insulation due to a higher insulation voltage in the existing circuit breaker system architecture, it is necessary to provide a circuit breaker apparatus and system.

A circuit breaker apparatus is provided, which includes:
a first switching assembly connected in series between a positive pole of a power supply and a load, wherein the first switching assembly includes a plurality of first switching units in series;
a first controller electrically connected to a first pre-set reference potential of the first switching assembly, wherein the first controller is electromagnetically coupled with each of the first switching units through a first transformer unit, the first controller is configured to control on and off of each of the first switching units;
a second switching assembly connected in series between a negative pole of the power supply and the load, wherein the second switching assembly includes a plurality of second switching units in series;
a second controller electrically connected to a second pre-set reference potential of the second switching assembly, wherein the second controller is electromagnetically coupled with each of the second switching units through a second transformer unit, the second controller is configured to control on and off of each of the second switching units.

In one of the embodiments, the first switching assembly includes N first switching units in series, the first pre-set reference potential is positioned between the $$\frac{N}{2}\text{-}th$$

one and the $$\left(\frac{N}{2}+1\right)\text{-}th$$

one of the first switching units;
the second switching assembly includes N second switching units in series, the second pre-set reference potential is positioned between the $$\frac{N}{2}\text{-}th$$

one and the $$\left(\frac{N}{2}+1\right)\text{-}th$$

one of the second switching units;
N is an even number.

In one of the embodiments, the first switching assembly includes n first switching units in series, the first pre-set reference potential is positioned between the $$\left(\frac{n+1}{2}\right)\text{-}th$$

one and the $$\left(\frac{n+1}{2}+1\right)\text{-}th$$

one of the first switching units;
the second switching assembly includes n second switching units in series, the second pre-set reference potential is positioned between the $$\left(\frac{n-1}{2}\right)\text{-}th$$

one and the $$\left(\frac{n-1}{2}+1\right)\text{-}th$$

one of the second switching units;
n is an odd number.

In one of the embodiments, the first switching assembly includes n first switching units in series, the first pre-set reference potential is positioned between the $$\left(\frac{n-1}{2}\right)\text{-}th$$

one and the $$\left(\frac{n-1}{2}+1\right)\text{-}th$$

one of the first switching units; the second switching assembly includes n second switching units in series, the second pre-set reference potential is positioned between the $$\left(\frac{n+1}{2}\right)\text{-}th$$

one and the $$\left(\frac{n+1}{2}+1\right)\text{-}th$$

one of the second switching units;
n is an odd number.

In one of the embodiments, the first switching assembly includes n first switching units in series, the first pre-set reference potential is positioned between the $$\left(\frac{n+1}{2}\right)\text{-}th$$

one and the $$\left(\frac{n+1}{2}+1\right)\text{-}th$$

one of the first switching units; the second switching assembly includes n second switching units in series, the second pre-set reference potential is positioned between the $$\left(\frac{n+1}{2}\right)\text{-}th$$

one and the $$\left(\frac{n+1}{2}+1\right)\text{-}th$$

one of the second switching units;
n is an odd number.

In one of the embodiments, the first switching assembly includes n first switching units in series, the first pre-set reference potential is positioned between the $$\left(\frac{n-1}{2}\right)\text{-}th$$

one and the $$\left(\frac{n-1}{2}+1\right)\text{-}th$$

one of the first switching units; the second switching assembly includes n second switching units in series, the second pre-set reference potential is positioned between the $$\left(\frac{n-1}{2}\right)\text{-}th$$

one and the $$\left(\frac{n-1}{2}+1\right)\text{-}th$$

one of the second switching units;
n is an odd number.

In one of the embodiments, the first switching unit includes:
a plurality of first switching strings in parallel, wherein each of the first switching strings includes a plurality of first switching tubes in series.

In one of the embodiments, the second switching unit includes:
a plurality of second switching strings in parallel, wherein each of the second switching strings includes a plurality of second switching tubes in series.

In one of the embodiments, the first switching unit includes a plurality of first switching tubes in parallel or in series.

In one of the embodiments, the second switching unit includes a plurality of second switching tubes in parallel or in series.

In one of the embodiments, the circuit breaker apparatus further includes:
a first radiator, wherein at least one of the first switching units is disposed on the first radiator.

In one of the embodiments, the circuit breaker apparatus further includes:
a second radiator, wherein at least one of the second switching units is disposed on the second radiator.

In one of the embodiments, the circuit breaker apparatus further includes:
a master controller in communication connection with the first controller and the second controller respectively.

A circuit breaker system is provided, which includes a plurality of the circuit breaker apparatuses of any one of the above-mentioned embodiments, the plurality of the circuit breaker apparatuses are connected in series, and the circuit breaker system further includes:
a master controller in communication connection with both the first controller and the second controller of each of the circuit breaker apparatuses.

In one of the embodiments, the circuit breaker system further includes:

an upper computer in communication connection with the master controller.

Compared with the prior art, the above-mentioned circuit breaker apparatus and system include a first switching assembly, a first controller, a second switching assembly and a second controller. The first switching assembly is connected in series between a positive pole of a power supply and a load. The first switching assembly includes a plurality of first switching units in series. The first controller is electrically connected to a first pre-set reference potential of the first switching assembly. The first controller is electromagnetically coupled with each of the first switching units through a first transformer unit. The first controller is configured to control on and off of each of the first switching units. The second switching assembly is connected in series between a negative pole of the power supply and the load. The second switching assembly includes a plurality of second switching units in series. The second controller is electrically connected to a second pre-set reference potential of the second switching assembly. The second controller is electromagnetically coupled with each of the second switching units through a second transformer unit. The second controller is configured to control on and off of each of the second switching units.

In the disclosure, the first controller is electrically connected to the first pre-set reference potential of the first switching assembly, the second controller is electrically connected to the second pre-set reference potential of the second switching assembly, and by means of coordination of the first switching assembly, the first controller, the second switching assembly and the second controller, the insulation voltage between the controller and the main power loop can be reduced, so as to reduce the difficulty in design of the insulation device in the circuit breaker apparatus and meanwhile improve reliability of the circuit breaker apparatus.

Figure 1:
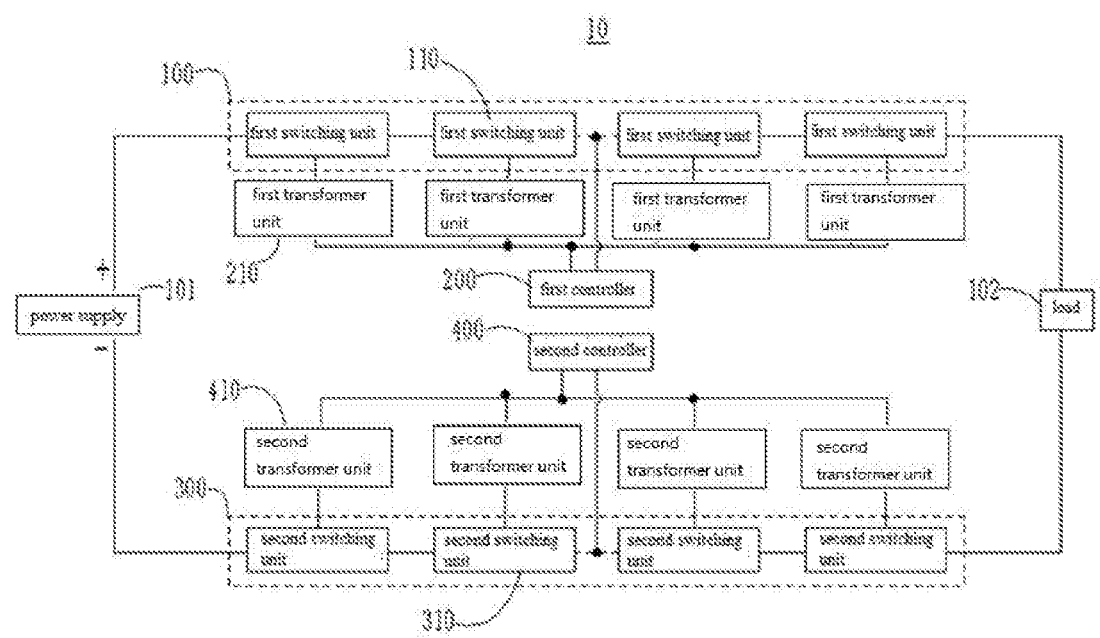
FIG. 1 is a structure block diagram of a circuit breaker apparatus provided by an embodiment of the present invention.

ELEMENTS LIST circuit breaker apparatus 10; first switching assembly 100; power supply 101; load 102; first switching unit 110; first switching string 111; first switching tube 112; first switching combination 113; first diode 114; circuit breaker system 20; first controller 200; first transformer unit 210; second switching assembly 300; second switching unit 310; second switching string 311; second switching tube 312; second switching combination 313; second diode 314; second controller 400; second transformer unit 410; first radiator 510; second radiator 520; master controller 600; upper computer 610.

DETAILED DESCRIPTION OF DISCLOSED EMBODIMENTS

In order to make the above objective, characteristics and advantages clearer and easier to understand, the present invention will be detailed hereinafter with reference to the accompanying drawings. The following specific details may facilitate a full understanding of the disclosure. However, the disclosure may be implemented in many different forms and is not limited to the embodiments described herein, those skilled in the art can make similar improvement without violating the connotation of the disclosure. Therefore, the present disclosure is not limited to the following specific embodiments.

It should be noted that when an element is referred to as being "fixed" to another element, the element can be directly on the other element or there may be a mediate element. When an element is referred to as "connected" to another element, the element can be directly connected to the other element or there may be a mediate element simultaneously.

Unless otherwise defined, all technical and scientific terms used herein have the same meaning as commonly understood by those skilled in the art belonging to the technical field of the disclosure. The terms used in the description of the present disclosure are for the purpose of describing specific embodiments and is not intended to limit the disclosure. The term "and/or" used herein includes any and all combinations of one or more of the associated listed items.

Referring to FIG. 1, an embodiment of the invention provides a circuit breaker apparatus 10, which includes a first switching assembly 100, a first controller 200, a second switching assembly 300 and a second controller 400. The first switching assembly 100 is connected in series between a positive pole of the power supply 101 and a load 102. The first switching assembly 100 includes a plurality of first switching units 110 in series. The first controller 200 is electrically connected to a first pre-disposed reference potential of the first switching assembly 100. The first controller 200 is electromagnetically coupled with each of the first switching units 110 through a first transformer unit 210. The first controller 200 is configured to control on and off of each of the first switching units 110.

The second switching assembly 300 is connected in series between the negative pole of the power supply 101 and the load 102. The second switching assembly 300 includes a plurality of second switching units 310 in series. The second controller 400 is electrically connected to a second pre-disposed reference potential of the second switching assembly 300. The second controller 400 is electromagnetically coupled with each of the second switching units 310 through a second transformer unit 410. The second controller 400 is configured to control on and off of each of the second switching units 310.

It should be appreciated that, the number of the first switching unit 110 included in the first switching assembly 100 is not limited, as long as the requirement of withstanding voltage of each of the first switching units 110 is satisfied. The specific number of the first switching unit 110 can be selected according to the actual requirement. In one embodiment, the first switching assembly 100 may include an even number of the first switching units 110. In one embodiment, the first switching assembly 110 may include an odd number of the first switching units 110.

It should be appreciated that, the position of the first pre-disposed reference potential is not limited, as long as guaranteeing that an insulation voltage between the first controller 200 and the main power loop can be reduced after the first controller 200 is electrically connected to the first pre-disposed reference potential. In one embodiment, the first pre-disposed reference potential is disposed at a position of a neutral point potential of the first switching assembly 100. In one embodiment, the first pre-disposed reference potential is disposed at a middle position (of the number) of a plurality of the first switching units 110 in the first switching assembly 100.

For example, the first switching assembly 100 includes four first switching units 110, then the first pre-disposed reference potential is disposed between the second one and the third one of the first switching units 110. Another example, the first switching assembly 100 includes five first switching units 110, then the first pre-disposed reference potential is disposed between the second one and third one of the first switching units 110, or between the third one and fourth one of the first switching units 110, or at the neutral point of the potential within the third one of the first switching units 110, i.e., at the middle potential point.

It should be appreciated that, the specific structure of the first switching unit 110 is not limited, as long as guaranteeing that the first switching unit 110 is capable of accepting the control of the first controller 200 so as to implement on and off between the power supply 101 and the load 102. The specific structure of the first switching unit 110 can be selected according to the actual requirement. In one embodiment, the first switching unit 110 can be made up of a plurality of switching tubes in parallel. In one embodiment, the first switching unit 110 can be made up of a plurality of switching tubes in series.

It should be appreciated that, the specific structure of the first transformer unit 210 is not limited, as long as guaranteeing that the first controller 200 is capable of controlling on and off of each of the first switching units 110 through the first transformer unit 210. In one embodiment, the first transformer unit 210 can be made up of one or more first transformers.

It should be appreciated that, the number of the second switching unit 310 included in the second switching assembly 300 is not limited, as long as satisfying the requirement of withstanding voltage of each of the second switching units 310. The specific number of the second switching unit 310 can be selected according to the actual requirement. In one embodiment, the second switching assembly 300 may include an even number of the second switching units 310. In one embodiment, the second switching assembly 300 may include an odd number of the second switching units 310.

In one embodiment, the second switching assembly 300 and the first switching assembly 100 are disposed symmetrically with respect to the load 102 or the power supply 101, and the first switching units 110 and the second switching units 310 have a consistent structure and the same number.

It should be appreciated that, the position of the second pre-disposed reference potential is not limited, as long as guaranteeing that the insulation voltage between the second controller 400 and the main power loop can be reduced after the second controller 400 is electrically connected to the second pre-disposed reference potential. In one embodiment, the second pre-disposed reference potential is disposed at the position of a neutral point potential of the second switching assembly 300. In one embodiment, the second pre-disposed reference potential is disposed at a middle position (of the number) of a plurality of the second switching units 310.

For example, the second switching assembly 300 includes four second switching units 310, then the second pre-disposed reference potential is disposed between the second one and third one of the second switching units 310. Another example, the second switching assembly 300 includes five second switching units 310, then the second pre-set reference potential is disposed between the second one and third one of the second switching units 310, or between the third one and fourth one of the second switching units 310, or at the neutral point of the potential within the third one of the second switching units 310, i.e., at the middle potential point.

It should be appreciated that, the specific structure of the second switching unit 310 is not limited, as long as guaranteeing that the second switching unit 310 is capable of accepting the control of the second controller 400 so as to implement on and off between the power supply 101 and the load 102. The specific structure of the second switching unit 310 can be selected according to the actual requirement. In one embodiment, the second switching unit 310 can be made up of a plurality of switching tubes in parallel. In one embodiment, the second switching unit 310 can be made up of a plurality of switching tubes in series.

It should be appreciated that, the specific structure of the second transformer unit 410 is not limited, as long as guaranteeing that the second controller 400 is capable of controlling on and off of each of the second switching units 310 through the second transformer unit 410. In one embodiment, the second transformer unit 410 can be made up of one or more first transformers.

In this embodiment, the first controller 200 is electrically connected to the first pre-set reference potential of the first switching assembly 100, the second controller 400 is electrically connected to the second pre-set reference potential of the second switching assembly 300, by coordination of the first switching assembly 100, the first controller 200, the second switching assembly 300 and the second controller 400, the insulation voltage between the controller and the main power loop can be reduced, so as to reduce the difficulty of insulation design in the circuit breaker apparatus 10.

In one embodiment, the first switching assembly 100 includes N first switching units 110 in series. The first pre-set reference potential is positioned between the $$\frac{N}{2}\text{-}th$$

one and $$\left(\frac{N}{2}+1\right)\text{-}th$$

one of the first switching units 110. The second switching assembly 300 includes N second switching units 310 in series. The second pre-set reference potential is positioned between the $$\frac{N}{2}\text{-}th$$

one and the $$\left(\frac{N}{2}+1\right)\text{-}th$$

one of the second switching units 310. The number N is an even number.

In one embodiment, the first switching units 110 and the second switching units 310 have a consistent structure and the same quantity, and the second switching assembly 300 and the first switching assembly 100 are symmetrically disposed with respect to the load 102 or the power supply 101. In one embodiment, the first pre-set reference potential is positioned between the $$\frac{N}{2}\text{-}th$$

one and the $$\left(\frac{N}{2}+1\right)\text{-}th$$

one of the first switching units 110, so as to reduce the insulation voltage between the first controller 200 and the main power loop.

In one embodiment, the second pre-set reference potential is positioned between the $$\frac{N}{2}\text{-}th$$

one and the $$\left(\frac{N}{2}+1\right)\text{-}th$$

one of the second switching units 310, so as to reduce the insulation voltage between the second controller 400 and the main power loop. Consequently, by coordinating with the first controller 200, it is able to reduce the difficulty of insulation design in the circuit breaker apparatus 10.

In one embodiment, the first switching assembly 100 includes n first switching units 110 in series. The first pre-set reference potential is positioned between the $$\left(\frac{n+1}{2}\right)\text{-}th$$

one and the $$\left(\frac{n+1}{2}+1\right)\text{-}th$$

one of the first switching units 110. The second switching assembly 300 includes n second switching units 310 in series. The second pre-set reference potential is positioned between the $$\left(\frac{n-1}{2}\right)\text{-}th$$

one and the $$\left(\frac{n-1}{2}+1\right)\text{-}th$$

one of the second switching units 310. The number n is an odd number.

In one embodiment, the first switching units 110 and the second switching units 310 have a consistent structure and the same quantity, and the second switching assembly 300 and the first switching assembly 100 are symmetrically disposed with respect to the load 102 or the power supply 101. In one embodiment, the first pre-set reference potential is positioned between the $$\left(\frac{n+1}{2}\right)\text{-}th$$

one and the $$\left(\frac{n+1}{2}+1\right)\text{-}th$$

one of the first switching units 110, so as to reduce the insulation voltage between the first controller 200 and the main power loop.

In one embodiment, the second pre-set reference potential is positioned between the $$\left(\frac{n-1}{2}\right)\text{-}th$$

one and the $$\left(\frac{n-1}{2}+1\right)\text{-}th$$

one of the second switching units 310, so as to reduce the insulation voltage between the second controller 400 and the main power loop. Thus, by coordinating with the first controller 200, it is able to reduce the difficulty of insulation design in the circuit breaker apparatus 10.

In one embodiment, the position of the first pre-set reference potential can be exchanged with the position of the second pre-set reference potential. In other words, the first pre-set reference potential is positioned between the $$\left(\frac{n-1}{2}\right)\text{-}th$$

one and the $$\left(\frac{n-1}{2}+1\right)\text{-}th$$

one of the first switching units 110, and the second pre-set reference potential is positioned between the $$\left(\frac{n+1}{2}\right)\text{-}th$$

one and the $$\left(\frac{n+1}{2}+1\right)\text{-}th$$

one of the second switching units 310. Above mentioned function also can be implemented.

In one embodiment, the first switching assembly 100 includes n first switching units 110 in series. The first pre-set reference potential is positioned between the $$\left(\frac{n+1}{2}\right)\text{-}th$$

one and the $$\left(\frac{n+1}{2}+1\right)\text{-}th$$

one of the first switching units 110. The second switching assembly 300 includes n second switching units 310 in series. The second pre-set reference potential is positioned between the $$\left(\frac{n+1}{2}\right)\text{-}th$$

one and the $$\left(\frac{n+1}{2}+1\right)\text{-}th$$

one of the second switching units 310. The number n is an odd number.

In one embodiment, the first switching unit 110 and the second switching unit 310 have a consistent structure and the same quantity, and the second switching assembly 300 and the first switching assembly 100 are symmetrically disposed with respect to the load 102 or the power supply 101. In one embodiment, the first pre-set reference potential is positioned between the $$\left(\frac{n+1}{2}\right)\text{-}th$$

one and the $$\left(\frac{n+1}{2}+1\right)\text{-}th$$

one of the first switching units 110, so as to reduce the insulation voltage between the first controller 200 and the main power loop.

In one embodiment, the second pre-set reference potential is positioned between the $$\left(\frac{n+1}{2}\right)\text{-}th$$

one and the $$\left(\frac{n+1}{2}+1\right)\text{-}th$$

one of the second switching units 310, so as to reduce the insulation voltage between the second controller 400 and the main power loop. Thus, by coordinating with the first controller 200, it is able to reduce the difficulty of insulation design in the circuit breaker apparatus 10.

In one embodiment, the first switching assembly 100 includes n first switching units 110 in series. The first pre-set reference potential is positioned between the $$\left(\frac{n-1}{2}\right)\text{-}th$$

one and the $$\left(\frac{n-1}{2}+1\right)\text{-}th$$

one of the first switching units 110.

The second switching assembly 300 includes n second switching units 310 in series. The second pre-set reference potential is positioned between the $$\left(\frac{n-1}{2}\right)\text{-}th$$

one and the $$\left(\frac{n-1}{2}+1\right)\text{-}th$$

one of the second switching units 310. The number n is an odd number.

In one embodiment, the first switching units 110 and the second switching units 310 have a consistent structure and the same quantity, and the second switching assembly 300 and the first switching assembly 100 are symmetrically disposed with respect to the load 102 or the power supply 101. In one embodiment, the first pre-set reference potential is positioned between the $$\left(\frac{n-1}{2}\right)\text{-}th$$

one and the $$\left(\frac{n-1}{2}+1\right)\text{-}th$$

one of the first switching units 110, so as to reduce the insulation voltage between the first controller 200 and the main power loop.

In one embodiment, the second pre-set reference potential is positioned between the $$\left(\frac{n-1}{2}\right)\text{-}th$$

one and the one $$\left(\frac{n-1}{2}+1\right)\text{-}th$$

of the second switching units 310, so as to reduce the insulation voltage between the second controller 400 and the main power loop. Thus, by coordinating with the first controller 200, it is able to reduce the difficulty of insulation design in the circuit breaker apparatus 10.

In one embodiment, the first switching assembly 100 includes n first switching units 110 in series, and the first switching unit 110 includes at least two first switching tubes 112 in series. The first pre-set reference potential is positioned at a middle potential point within the $$\left(\frac{n+1}{2}\right)\text{-}th$$

one of the first switching units 110. The second switching assembly 300 includes n second switching units 310 in series, and the second switching unit 310 includes at least two second switching tubes 312 in series. The second pre-set reference potential is positioned at a middle potential point within the $$\left(\frac{n+1}{2}\right)\text{-}th$$

one of the second switching units 310. The number n is an odd number.

In one embodiment, the first switching unit 110 and the second switching unit 310 have a consistent structure and the same quantity, and the second switching assembly 300 and the first switching assembly 100 are symmetrically disposed with respect to the load 102 or the power supply 102. In one embodiment, the first pre-set reference potential is positioned at a middle potential point within the $$\left(\frac{n+1}{2}\right)\text{-}th$$

one of the first switching units 110, so as to reduce the insulation voltage between the first controller 200 and the main power loop.

In one embodiment, the second pre-set reference potential is positioned at a middle potential point within the $$\left(\frac{n+1}{2}\right)\text{-}th$$

one of the second switching units 310, so as to reduce the insulation voltage between the second controller 400 and the main power loop. Thus, by coordinating with the first controller 200, it is able to reduce the difficulty of insulation design in the circuit breaker apparatus 10.

Figure 2:
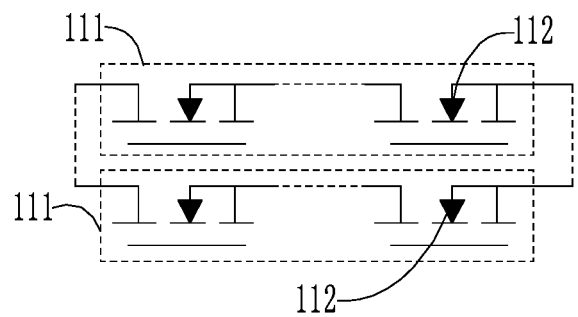
FIG. 2 is a structure schematic diagram I of a first switching unit provided by an embodiment of the present invention.

Referring to FIG. 2, in one embodiment, the first switching unit 110 includes a plurality of first switching strings 111 in parallel. Each of the first switching strings 111 includes a plurality of first switching tubes 112 in series. It should be appreciated that, the specific structure of the first switching tube 112 is not limited, as long as guaranteeing that the first controller 200 can control on and off of the first switching tube 112. The specific structure of the first switching tube 112 can be selected according to the actual requirement. In one embodiment, the first switching tube 112 may be a Metal Oxide Semiconductor Field Effect Transistor (MOSFET). In one embodiment, the first switching tube 112 may be an Insulated Gate Bipolar Transistor (IGBT).

Figure 3:
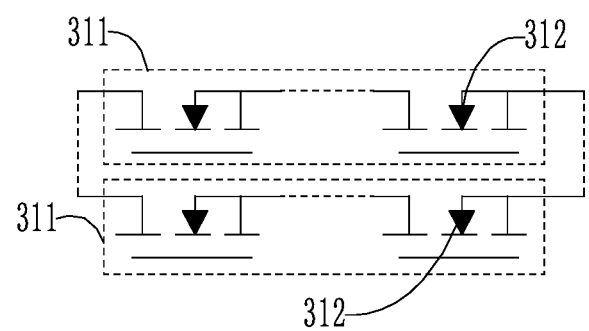
FIG. 3 is a structure schematic diagram I of a second switching unit provided by an embodiment of the present invention.

Referring to FIG. 3, in one embodiment, the second switching unit 310 includes a plurality of second switching strings 311 in parallel. Each of the second switching strings 311 includes a plurality of second switching tubes 312 in series. It should be appreciated that, the specific structure of the second switching tube 312 is not limited, as long as guaranteeing that the second controller 400 can control on and off of the second switching tube 312. The specific structure of the second switching tube 312 can be selected according to the actual requirement. In one embodiment, the second switching tube 312 may be a Metal Oxide Semiconductor Field Effect Transistor (MOSFET). In one embodiment, the second switching tube 312 may be an Insulated Gate Bipolar Transistor (IGBT).

Figure 4:
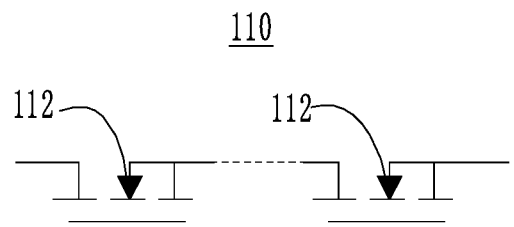
FIG. 4 is a structure schematic diagram II of a first switching unit provided by an embodiment of the present invention.
Figure 5:
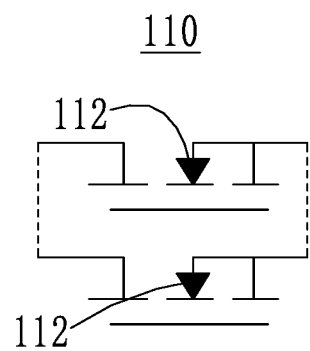
FIG. 5 is a structure schematic diagram III of a first switching unit provided by an embodiment of the present invention.

Referring to FIG. 4 and FIG. 5, in one embodiment, the first switching unit 110 includes a plurality of first switching tubes 112 in parallel or in series. It should be appreciated that, the specific structure of the first switching tube 112 is not limited, as long as guaranteeing that the first controller 200 can control on and off of the first switching tube 112. The specific structure of the first switching tube 112 can be selected according to the actual requirement. In one embodiment, the first switching tube 112 may be a Metal Oxide Semiconductor Field Effect Transistor (MOSFET). In one embodiment, the first switching tube 112 may be an Insulated Gate Bipolar Transistor (IGBT).

Figure 6:
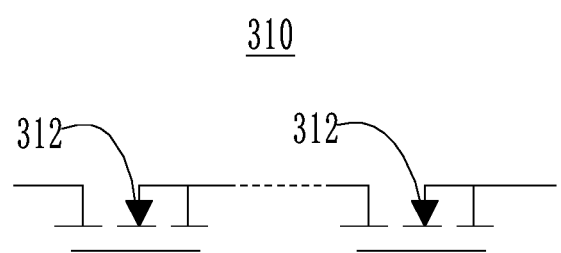
FIG. 6 is a structure schematic diagram II of a second switching unit provided by an embodiment of the present invention.
Figure 7:
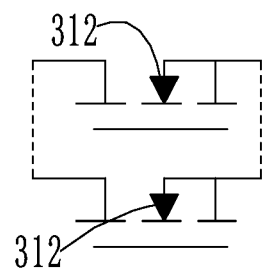
FIG. 7 is a structure schematic diagram III of a second switching unit provided by an embodiment of the present invention.

Referring to FIG. 6 and FIG. 7, in one embodiment, the second switching unit 310 includes a plurality of second switching tubes 312 in parallel or in series. It should be appreciated that, the specific structure of the second switching tube 312 is not limited, as long as guaranteeing that the second controller 400 can control on and off of the second switching tube 312. The specific structure of the second switching tube 312 can be selected according to the actual requirement. In one embodiment, the second switching tube 312 may be a Metal Oxide Semiconductor Field Effect Transistor (MOSFET). In one embodiment, the second switching tube 312 may be an Insulated Gate Bipolar Transistor (IGBT).

Figure 8:
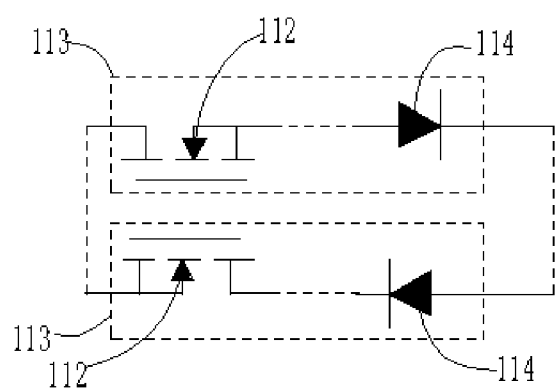
FIG. 8 is a structure schematic diagram IV of a first switching unit provided by an embodiment of the present invention.

Referring to FIG. 8, in one embodiment, the first switching unit 110 includes at least two anti-parallel first switching combinations 113, and each of the first switching combinations 113 includes a plurality of first switching tubes 112 and at least one first diode 114 in series. It should be appreciated that, the specific structure of the first switching tube 112 is not limited, as long as guaranteeing that the first controller 200 can control on and off of the first switching tube 112. The specific structure of the first switching tube 112 can be selected according to the actual requirement. In one embodiment, the first switching tube 112 may be a Metal Oxide Semiconductor Field Effect Transistor (MOSFET). In one embodiment, the first switching tube 112 may be an Insulated Gate Bipolar Transistor (IGBT).

It should be appreciated that, the specific structure of the first diode 114 is not limited, as long as guaranteeing that the unidirectional conductivity of the first diode 114 can be utilized such that the first switching unit 110 has a function of bidirectional controllable on and off. The specific quantity of the first diode 114 is not limited, as long as guaranteeing that the requirement of withstanding voltage thereof is satisfied. The specific quantity of the first diode 114 can be selected according to the actual requirement of withstanding voltage.

Figure 9:
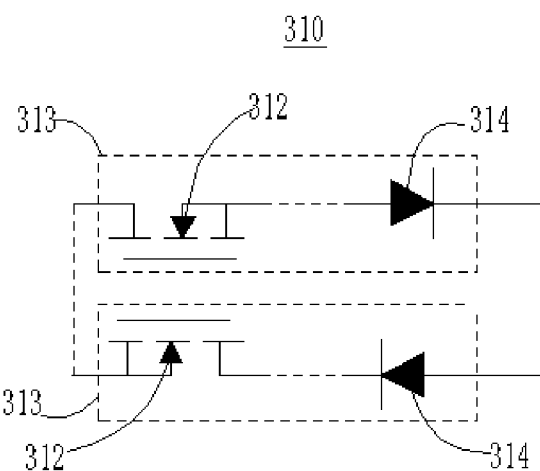
FIG. 9 is a structure schematic diagram IV of a second switching unit provided by an embodiment of the present invention.

Referring to FIG. 9, in one embodiment, the second switching unit 310 includes at least two anti-parallel second switching combinations 313, each of the second switching combinations 313 includes a plurality of second switching tubes 312 and at least one second diode 314 in series. It should be appreciated that, the specific structure of the second switching tube 312 is not limited, as long as guaranteeing that the second controller 400 can control on and off of the second switching tube 312. The specific structure of the second switching tube 312 can be selected according to the actual requirement. In one embodiment, the second switching tube 312 may be a Metal Oxide Semiconductor Field Effect Transistor (MOSFET). In one embodiment, the second switching tube 312 may be an Insulated Gate Bipolar Transistor (IGBT).

It should be appreciated that, the specific structure of the second diode 314 is not limited, as long as guaranteeing that the unidirectional conductivity of the second diode 314 can be utilized such that the second switching unit 310 has a function of bidirectional controllable on and off. The specific quantity of the second diode 314 is not limited, as long as guaranteeing that the requirement of withstanding voltage thereof is satisfied. The specific quantity of the second diode 314 can be selected according to the actual requirement of withstanding voltage.

Figure 10:
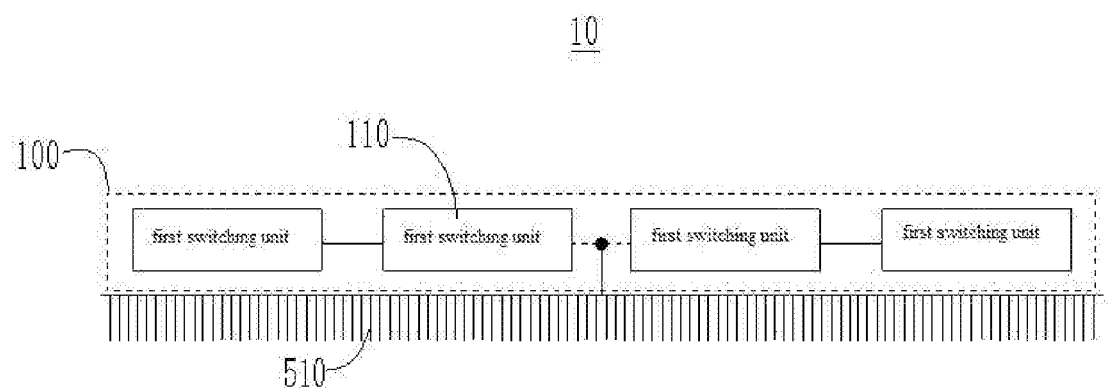
FIG. 10 is a structure schematic diagram of a first radiator provided by an embodiment of the present invention.

Referring to FIG. 10, in one embodiment, the circuit breaker apparatus 10 further includes a first radiator 510. At least one of the first switching units 110 is disposed on the first radiator 510. In one embodiment, a plurality of the first switching units 110 can share one first radiator 510. In one embodiment, the potential reference point of the first radiator 510 is electrically connected to the first pre-set reference potential, so as to reduce the insulation voltage between the first radiator 510 and the first switching unit 110. Thus, the difficulty of insulation design can be reduced. Meanwhile, the first radiator 510 further has an advantage of convenient installation.

Figure 11:
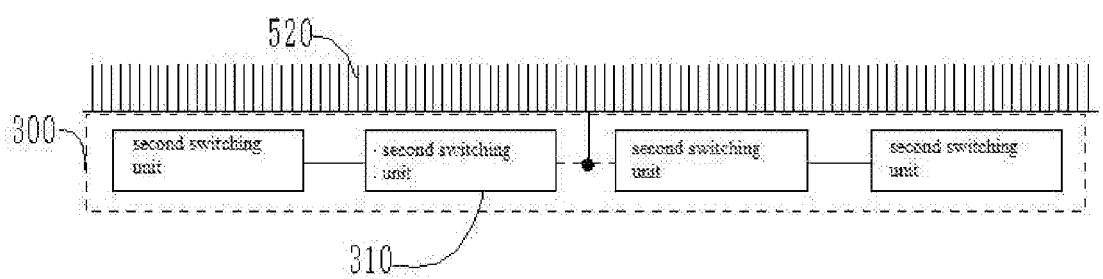
FIG. 11 is a structure schematic diagram of a second radiator provided by an embodiment of the present invention.

Referring to FIG. 11, in one embodiment, the circuit breaker apparatus 10 further includes a second radiator 520. At least one of the second switching units 310 is disposed on the second radiator 520. In one embodiment, a plurality of the second switching units 310 can share one second radiator 520. In one embodiment, the potential reference point of the second radiator 520 is electrically connected to the second pre-set reference potential, so as to reduce the insulation voltage between the second radiator 520 and the second switching unit 310. Thus, the difficulty of insulation design can be reduced. Meanwhile, the second radiator 520 has an advantage of convenient installation.

Figure 12:
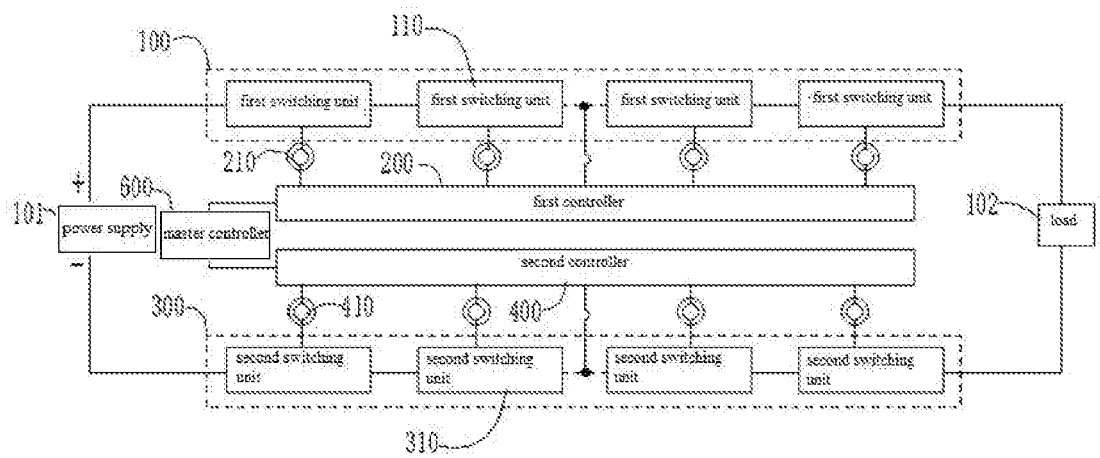
FIG. 12 is a structure schematic diagram of a circuit breaker apparatus provided by an embodiment of the present invention.

Referring to FIG. 12, in one embodiment, the circuit breaker apparatus 10 further includes a master controller 600. The master controller 600 establishes a communication connection with the first controller 200 and the second controller 400 respectively. It should be appreciated that, the mode of the communication connection between the master controller 600 and the first controller 200 or the second controller 400 is not limited, as long as guaranteeing that the master controller 600 can communicate with the first controller 200 and the second controller 400 respectively, to implement the function of issuing a control signal and receiving a fault signal. In one embodiment, the master controller 600 can communicate with the first controller 200 and the second controller 400 through optical fiber.

Figure 13:
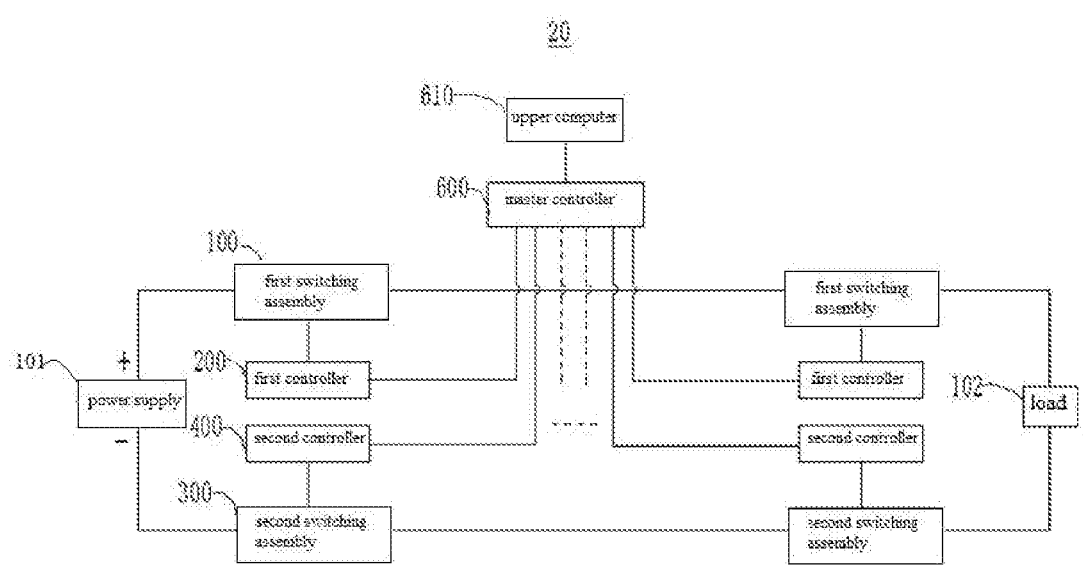
FIG. 13 is a structure block diagram of a circuit breaker system provided by an embodiment of the present invention.

Referring to FIG. 13, an embodiment of the invention provides a circuit breaker system 20, including a plurality of the circuit breaker apparatuses 10 according to any one of the above embodiments. A plurality of the circuit breaker apparatuses 10 are connected in series. The circuit breaker system 20 further includes a master controller 600. Both the first controller 200 and the second controller 400 of each of the circuit breaker apparatuses 10 are in communication connection with the master controller 600.

It should be appreciated that, the mode of communication connection of the master controller 600 with the first controller 200 and the second controller 400 of each of the circuit breaker apparatuses 10 is not limited, as long as guaranteeing that the master controller 600 can communicate with the first controller 200 and the second controller 400 of each of the circuit breaker apparatuses 10, to implement the function of issuing all the control signals and receiving the fault signals. In one embodiment, the master controller 600 can communicate with the first controller 200 and the second controller 400 of each of the circuit breaker apparatuses 10 through optical fiber.

In one embodiment, the circuit breaker system 20 further includes an upper computer 610. The upper computer 610 is in communication connection with the master controller 600. It should be appreciated that, the mode of communication connection between the upper computer 610 and the master controller 600 is not limited, as long as guaranteeing intercommunication between the upper computer 610 and the master controller 600 to implement a function of human-computer interaction. In one embodiment, the upper computer 610 can communicate with the master controller 600 through optical fiber. In one embodiment, the upper computer 610 can communicate with the master controller 600 through a mode of wireless data transmission. In one embodiment, the mode of the wireless data transmission may be Bluetooth, WIFI and so on.

In conclusion, in the present disclosure, the first controller 200 is electrically connected to the first pre-set reference potential of the first switching assembly 100, the second controller 400 is electrically connected to the second pre-set reference potential of the second switching assembly 300, through the coordination of the first switching assembly 100, the first controller 200, the second switching assembly 300 and the second controller 400, the insulation voltage between the controller and the main power loop can be reduced, so as to reduce the difficulty of insulation design in the circuit breaker apparatus 10 and meanwhile improve reliability of the circuit breaker apparatus 10.

Various technical features of the above embodiments can be combined discretionarily. In order to make the description concise, not all possible combinations of the various technical features in the above-mentioned embodiments are illustrated here. However, the combinations of these technical features, as long as no contradiction, should be considered to be within the scope of the disclosure.

The above-mentioned embodiments are merely illustrative of several embodiments of the present invention, and the description thereof is more specific and detailed, but is not understood as limiting the scope of the invention. It should be noted that a number of variations and modifications may be made by those skilled in the art without departing from the spirit of the disclosure, and these variations and modifications also belong to the scope of the disclosure. Therefore, the scope of the disclosure should be subject to the appended claims.

What is claimed is:

1. A circuit breaker apparatus, comprising:
   a first switching assembly connected in series between a positive pole of a power supply and a load, wherein the first switching assembly comprises a plurality of first switching units in series;
   a first controller electrically connected to a first pre-set reference potential of the first switching assembly, wherein the first controller is electromagnetically coupled with each of the first switching units through a first transformer unit, the first controller is configured to control on and off of each of the first switching units;
   a second switching assembly connected in series between a negative pole of the power supply and the load, wherein the second switching assembly comprises a plurality of second switching units in series;
   a second controller electrically connected to a second pre-set reference potential of the second switching assembly, wherein the second controller is electromagnetically coupled with each of the second switching units through a second transformer unit, the second controller is configured to control on and off of each of the second switching units.

2. The circuit breaker apparatus according to claim 1, wherein, the first switching assembly comprises N first switching units in series, the first pre-set reference potential is positioned between the $$\frac{N}{2}\text{-}th$$

one and the $$\left(\frac{N}{2}+1\right)\text{-}th$$

one of the first switching units;
   the second switching assembly comprises N second switching units in series, the second pre-set reference potential is positioned between the $$\frac{N}{2}\text{-}th$$

one and the $$\left(\frac{N}{2}+1\right)\text{-}th$$

one of the second switching units;
   N is an even number.

3. The circuit breaker apparatus according to claim 1, wherein, the first switching assembly comprises n first switching units in series, the first pre-set reference potential is positioned between the $$\left(\frac{n+1}{2}\right)\text{-}th$$

one and the $$\left(\frac{n+1}{2}+1\right)\text{-}th$$

one of the first switching units;
   the second switching assembly comprises n second switching units in series, the second pre-set reference potential is positioned between the $$\left(\frac{n-1}{2}\right)\text{-}th$$

one and the $$\left(\frac{n-1}{2}+1\right)\text{-}th$$

one of the second switching units;
   n is an odd number.

4. The circuit breaker apparatus according to claim 1, wherein, the first switching assembly comprises n first switching units in series, the first pre-set reference potential is positioned between the $$\left(\frac{n-1}{2}\right)\text{-}th$$

one and the $$\left(\frac{n-1}{2}+1\right)\text{-}th$$

one of the first switching units;
the second switching assembly comprises n second switching units in series, the second pre-set reference potential is positioned between the $$\left(\frac{n+1}{2}\right)\text{-}th$$

one and the $$\left(\frac{n+1}{2}+1\right)\text{-}th$$

one of the second switching units;
n is an odd number.

5. The circuit breaker apparatus according to claim 1, wherein, the first switching assembly comprises n first switching units in series, the first pre-set reference potential is positioned between the $$\left(\frac{n+1}{2}\right)\text{-}th$$

one and the $$\left(\frac{n+1}{2}+1\right)\text{-}th$$

one of the first switching units;
the second switching assembly comprises n second switching units in series, the second pre-set reference potential is positioned between the $$\left(\frac{n+1}{2}\right)\text{-}th$$

one and the $$\left(\frac{n+1}{2}+1\right)\text{-}th$$

one of the second switching units;
n is an odd number.

6. The circuit breaker apparatus according to claim 1, wherein, the first switching assembly comprises n first switching units in series, the first pre-set reference potential is positioned between the $$\left(\frac{n-1}{2}\right)\text{-}th$$

one and the $$\left(\frac{n-1}{2}+1\right)\text{-}th$$

one of the first switching units;
the second switching assembly comprises n second switching units in series, the second pre-set reference potential is positioned between the $$\left(\frac{n-1}{2}\right)\text{-}th$$

one and the $$\left(\frac{n-1}{2}+1\right)\text{-}th$$

one of the second switching units;
n is an odd number.

7. The circuit breaker apparatus according to claim 1, wherein, the first switching unit comprises:
a plurality of first switching strings in parallel, wherein each of the first switching strings comprises a plurality of first switching tubes in series.

8. The circuit breaker apparatus according to claim 7, wherein, the second switching unit comprises:
a plurality of second switching strings in parallel, wherein each of the second switching strings comprises a plurality of second switching tubes in series.

9. The circuit breaker apparatus according to claim 1, wherein, the first switching unit comprises a plurality of first switching tubes in parallel or in series.

10. The circuit breaker apparatus according to claim 9, wherein, the second switching unit comprises a plurality of second switching tubes in parallel or in series.

11. The circuit breaker apparatus according to claim 1, further comprising:
a first radiator, wherein at least one of the first switching units is disposed on the first radiator.

12. The circuit breaker apparatus according to claim 11, further comprising:
a second radiator, wherein at least one of the second switching units is disposed on the second radiator.

13. The circuit breaker apparatus according to claim 1, further comprising:
a master controller in communication connection with the first controller and the second controller respectively.

14. A circuit breaker system, comprising a plurality of the circuit breaker apparatuses of claim 1, wherein the plurality of the circuit breaker apparatuses are connected in series, the circuit breaker system further comprises:

a master controller in communication connection with both the first controller and the second controller of each of the circuit breaker apparatuses.

15. The circuit breaker system according to claim 14, further comprising:
an upper computer in communication connection with the master controller.

16. The circuit breaker system according to claim 14, wherein, the first switching assembly comprises N first switching units in series, the first pre-set reference potential is positioned between the $$\frac{N}{2}\text{-th}$$

one and the $$\left(\frac{N}{2}+1\right)\text{-th}$$

one of the first switching units;
the second switching assembly comprises N second switching units in series, the second pre-set reference potential is positioned between the $$\frac{N}{2}\text{-th}$$

one and the $$\left(\frac{N}{2}+1\right)\text{-th}$$

one of the second switching units;
N is an even number.

17. The circuit breaker system according to claim 14, wherein, the first switching assembly comprises n first switching units in series, the first pre-set reference potential is positioned between the $$\left(\frac{n+1}{2}\right)\text{-th}$$

one and the $$\left(\frac{n+1}{2}+1\right)\text{-th}$$

one of the first switching units;
the second switching assembly comprises n second switching units in series, the second pre-set reference potential is positioned between the $$\left(\frac{n-1}{2}\right)\text{-th}$$

one and the $$\left(\frac{n-1}{2}+1\right)\text{-th}$$

one of the second switching units;
n is an odd number.

18. The circuit breaker system according to claim 14, wherein, the first switching assembly comprises n first switching units in series, the first pre-set reference potential is positioned between the $$\left(\frac{n-1}{2}\right)\text{-th}$$

one and the $$\left(\frac{n-1}{2}+1\right)\text{-th}$$

one of the first switching units;
the second switching assembly comprises n second switching units in series, the second pre-set reference potential is positioned between the one $$\left(\frac{n+1}{2}\right)\text{-th}$$

and the $$\left(\frac{n+1}{2}+1\right)\text{-th}$$

one of the second switching units;
n is an odd number.

19. The circuit breaker system according to claim 14, wherein, the first switching assembly comprises n first switching units in series, the first pre-set reference potential is positioned between the $$\left(\frac{n+1}{2}\right)\text{-th}$$

one and the $$\left(\frac{n+1}{2}+1\right)\text{-th}$$

one of the first switching units;
the second switching assembly comprises n second switching units in series, the second pre-set reference potential is positioned between the $$\left(\frac{n+1}{2}\right)\text{-th}$$

one and the $$\left(\frac{n+1}{2}+1\right)\text{-th}$$

one of the second switching units;
n is an odd number.

20. The circuit breaker system according to claim 14, wherein, the first switching assembly comprises n first switching units in series, the first pre-set reference potential is positioned between the $$\left(\frac{n-1}{2}\right)\text{-th}$$

one and the $$\left(\frac{n-1}{2}+1\right)\text{-th}$$

one of the first switching units;
the second switching assembly comprises n second switching units in series, the second pre-set reference potential is positioned between the $$\left(\frac{n-1}{2}\right)\text{-th}$$

one and the $$\left(\frac{n-1}{2}+1\right)\text{-th}$$

one of the second switching units;
n is an odd number.

* * * * *